on9384795B1

(12) United States Patent
Hoff et al.

(10) Patent No.: US 9,384,795 B1
(45) Date of Patent: Jul. 5, 2016

(54) FULLY VALID-GATED READ AND WRITE FOR LOW POWER ARRAY

(71) Applicant: QUALCOMM Incorporated, San Diego, CA (US)

(72) Inventors: David Paul Hoff, Raleigh, NC (US); Jason Philip Martzloff, Chapel Hill, NC (US); Robert Andrew Sweitzer, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/698,843

(22) Filed: Apr. 29, 2015

(51) Int. Cl.
*G11C 7/10* (2006.01)
*G11C 7/12* (2006.01)
*G11C 7/22* (2006.01)

(52) U.S. Cl.
CPC ....... *G11C 7/106* (2013.01); *G11C 7/10* (2013.01); *G11C 7/1087* (2013.01); *G11C 7/12* (2013.01); *G11C 7/22* (2013.01)

(58) Field of Classification Search
CPC .............. G11C 7/00; G11C 7/10; G11C 7/12; G11C 7/22; G11C 8/08; G11C 15/00; G11C 29/00
USPC ............ 365/189.05, 189.07, 189.08, 189.11, 365/189.15, 189.16, 185.22, 203, 230.06, 365/230.08
See application file for complete search history.

(56) References Cited

U.S. PATENT DOCUMENTS

| 6,160,743 | A | 12/2000 | Parris | |
|---|---|---|---|---|
| 6,609,209 | B1 | 8/2003 | Tiwari et al. | |
| 6,728,124 | B1 * | 4/2004 | Ichiriu | G11C 15/00 365/189.07 |
| 6,804,135 | B1 * | 10/2004 | Srinivasan | G11C 15/00 365/189.05 |
| 7,043,673 | B1 * | 5/2006 | Ichiriu | G11C 15/00 714/719 |
| 7,050,331 | B2 * | 5/2006 | Matsuoka | G11C 16/0475 257/315 |
| 7,974,143 | B2 | 7/2011 | Lee | |
| 2012/0243364 | A1 | 9/2012 | Hacking et al. | |
| 2014/0032829 | A1 | 1/2014 | Solihin | |

* cited by examiner

*Primary Examiner* — Gene Auduong
(74) *Attorney, Agent, or Firm* — Muncy, Geissler, Olds & Lowe, P.C.

(57) ABSTRACT

In an array that qualifies each row according to a valid/invalid state, each row may each include valid-gated read circuitry to conditionally block a read wordline from toggling unless the row stores a data word that has a valid state or a read force signal is asserted. Furthermore, in a write operation, each row may have valid-gated write circuitry that conditionally blocks a write wordline from toggling unless input data to be written to the row has a valid state or a write force signal is asserted. Moreover, output latch clocking may be blocked from toggling unless a row to be read stores a data word that has a valid state or the read force signal is asserted, and input latch clocking may also be blocked unless the input data to be written has a valid state or the write force signal is asserted.

36 Claims, 4 Drawing Sheets

FULLY VALID-GATED READ AND WRITE FOR LOW POWER ARRAY

TECHNICAL FIELD

The disclosure generally relates to array structure power optimizations, and in particular, to fully valid-gated read and write circuitry in a low power array.

BACKGROUND

Array structures that have a valid state associated with each entry needlessly consume power when reading an invalid entry or writing invalid data due to unnecessarily toggling nets (e.g., comparison circuitry) associated with the data bits corresponding to the invalid entry. For example, during a read operation, comparison circuitry associated with each row in the array structure will toggle despite the fact that any rows in the array structure that store an invalid data word do not provide usable output. Similarly, during an invalid write in which a valid bit is written to an invalid state, the data bits are written even though the data bits will never be used because the entry is invalid. For example, in a multi-threaded application where one or more threads are used to write invalid data (e.g., for debugging purposes), write wordlines, input latch clocks, and internal write bitlines (which may be on an elevated voltage domain for dual-rail macros) will needlessly toggle even though the invalid input data will not be used. Accordingly, when reading or writing an invalid entry in an array structure, unnecessary power consumption can occur because an invalid access may toggle wordlines, bitlines, high capacitance outputs, and/or other circuitry (or nets), which may be especially undesirable in low-power array structures such as those often used in battery-powered electronic devices. In particular, increased power consumption can lead to faster battery drain and shorter battery life, which tends to be an important consideration in many (if not all) battery-powered electronic devices. As such, there exists a need to reduce the unnecessary power consumption that may occur when performing invalid read and/or write operations in low-power array structures.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments disclosed herein in a simplified form to precede the detailed description presented below.

According to various aspects, a memory may comprise an array having one or more rows configured to store a data word, wherein the one or more rows may each include valid-gated read circuitry configured to store data that indicates whether the data word stored in the corresponding row has a valid state and conditionally gate a read wordline path in the corresponding row according to at least the stored data. In addition, the memory may include one or more output latches configured to output data read from the array and valid-gated output latch clocking coupled to the one or more output latches and to the valid-gated read circuitry in each row, wherein the valid-gated output latch clocking may include circuitry configured to conditionally gate a read clock configured to open the one or more output latches according to at least the stored data that indicates whether the data word stored in an indexed row in the array has a valid state. Furthermore, in various embodiments, the valid-gated read circuitry and the valid-gated output latch clocking may each include one or more logic gates respectively configured to block the read wordline from toggling and to block the read clock from toggling unless the stored data indicates that the data word stored in the row has a valid state or the read force signal is asserted.

According to various aspects, a method for qualified read access in an array may comprise conditionally gating a read wordline associated with an array entry according to at least a first signal that indicates whether a data word stored in the array entry has a valid or invalid state and conditionally gating an output latch clock signal according to at least the first signal that indicates whether the data word stored in the array entry has a valid or invalid state. Additionally, in various embodiments, the method may further comprise conditionally gating the read wordline associated with the array entry according to a second signal that forces the read wordline to toggle when asserted. For example, conditionally gating the read wordline associated with the array entry according to the first signal and the second signal may block the read wordline from toggling unless the first signal indicates that the array entry has a valid state and/or the second signal is asserted to force the read wordline to toggle. Furthermore, in various embodiments, the method may comprise conditionally gating the output latch clock signal according to the second signal, which may similarly block the output latch clock signal from toggling unless the first signal indicates that the array entry has a valid state and/or the second signal is asserted.

According to various embodiments, an apparatus may comprise means for storing a data word, means for conditionally gating a read wordline used to read the stored data word according to at least a first signal that indicates whether the stored data word has a valid state, and means for conditionally gating an output latch clock signal according to at least the first signal that indicates whether the stored data word has a valid state.

According to various embodiments, a memory may comprise an array having one or more rows configured to store a data word, wherein the one or more rows each include valid-gated write circuitry configured to conditionally gate a write wordline path in the corresponding row according to at least a first signal that indicates whether input data to be written to the corresponding row has a valid state, one or more input latches coupled to one or more bitlines configured to activate write circuitry in the array, and valid-gated input latch clocking coupled to the one or more input latches and to the valid-gated write circuitry in each row, wherein the valid-gated input latch clocking includes circuitry configured to conditionally gate a write clock to the one or more input latches according to at least the first signal that indicates whether the input data to be written has a valid state. Furthermore, in various embodiments, the valid-gated write circuitry in each row and the circuitry associated with the valid-gated input latch clocking may each include at least one logic gate that are respectively configured to conditionally gate the write wordline path and the write clock according to the first signal and a write force signal that forces the write wordline to toggle when asserted. As such, the write wordline and the write clock may be blocked from toggling unless the first signal indicates that the input data to be written has a valid state or the second signal is asserted.

According to various aspects, a method for qualified write access in an array may comprise conditionally gating a write wordline associated with an array entry according to at least a first signal that indicates whether input data to be written to the array entry has a valid or invalid state and conditionally gating an input latch clock signal according to at least the first signal that indicates whether the input data to be written has a valid or invalid state. Additionally, in various embodiments, the method may further comprise conditionally gating the write wordline associated with the array entry according to a second signal that forces the write wordline to toggle when asserted. For example, conditionally gating the write wordline associated with the array entry according to the first signal and the second signal may block write clocking on the write wordline from toggling unless the first signal indicates that the input data to be written to the array entry has a valid state and/or the second signal is asserted. Furthermore, in various embodiments, the method may additionally comprise conditionally gating the input latch clock signal according to the second signal, which may similarly block the input latch clock signal from toggling unless the first signal indicates that the input data to be written to the array entry has a valid state and/or the second signal is asserted. However, in the qualified write access method, an indexed valid bit associated with the array entry may be unconditionally written to preserve the state associated with the input data to be written to the array entry.

According to various aspects, an apparatus may comprise means for conditionally gating a write wordline used to write input data to an array entry according to at least a first signal that indicates whether the input data to be written to the array entry has a valid or invalid state and means for conditionally gating an input latch clock signal according to at least the first signal that indicates whether the input data to be written has a valid or invalid state. As such, the means for conditionally gating the write wordline and the means for conditionally gating the input latch clock signal may respectively block the write wordline and the input latch clock signal from toggling unless the first signal indicates that the input data to be written to the array entry has a valid state or a second signal that forces the write wordline to toggle is asserted.

Other objects and advantages associated with the various aspects and/or embodiments disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

DETAILED DESCRIPTION

Various aspects are disclosed in the following description and related drawings to show examples directed to specific exemplary embodiments. Alternate embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage, or mode of operation.

The terminology used herein describes particular embodiments only and should be construed to limit any embodiments disclosed herein. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., an application specific integrated circuit (ASIC)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each aspect and/or embodiment described herein, the corresponding form of any such aspect and/or embodiment may be described herein as, for example, "logic configured to" perform the described action.

Figure 1:
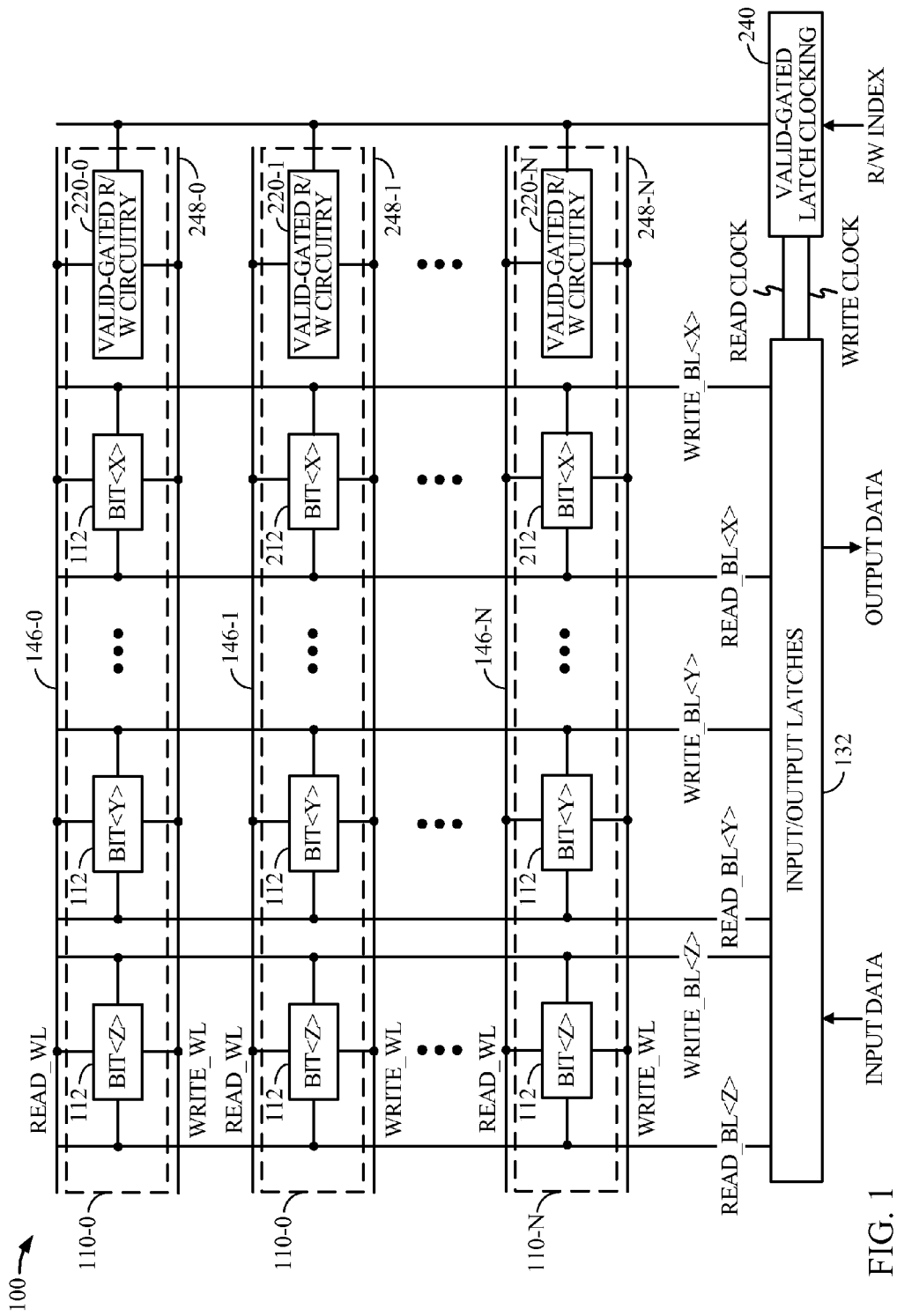
FIG. 1 illustrates an exemplary memory that includes an array with fully valid-gated read/write circuitry and valid-gated latch clocking circuitry, according to various aspects.

According to various aspects, FIG. 1 illustrates an exemplary memory 100 that includes an array with fully valid-gated read/write circuitry and valid-gated latch clocking circuitry, which can be implemented in any suitable memory having an array structure that qualifies each entry according to a valid/invalid state. In various embodiments, the memory 100 includes various bit cells 112 arranged into an array having rows 110-0 through 110-N, which are generally referred to herein collectively as array 110 and individually as array rows 110. Notably, while the array 110 in FIG. 1 includes the array rows 110-0 through 110-N in a two-dimensional arrangement, the term "array" used herein is not limited to a two-dimensional arrangement. Rather, in various embodiments, the array 110 may have any suitable configuration in which the bit cells 112 in a particular array row 110 stores a digital data word, which may comprise, for example, eight bits, sixteen bits, thirty-two bits, sixty-four bits, one hundred twenty-eight bits, or the like. Further, the array rows 110 may include, for example, bit cells 112 in a single-level integrated circuit or may include bit cells 112 on multiple levels in a multi-level integrated circuit.

In various embodiments, the array rows 110-0 through 110-N each include valid-gated read/write circuitry numbered 120-0 through 120-N, which are generally referred to herein collectively and individually as valid-gated read/write circuitry 120. Furthermore, each array row 110 may include one or more bit cells 112 configured to store one (1) data bit numbered from <z> to <x>, which collectively corresponds to a digital data word, wherein the valid-gated read/write circuitry 120 in each respective array row 110 includes a valid bit cell (not shown) that stores a bit value (e.g., either zero or one) to represent whether the digital data word stored in the corresponding array row 110 has a valid state or an invalid state. For example, because the memory 100 can store the same digital data word in multiple different array rows 110, the valid bit cell in the valid-gated read/write circuitry 120 associated with each array row 110 can be used to mark the particular array row 120 that stores the correct digital data word. However, those skilled in the art will appreciate that the valid bit cell may be used to indicate that the digital data word stored in the corresponding array row 110 according to any suitable criteria.

Furthermore, in various embodiments, the bit cells 112 in each array row 110 may be coupled to the valid-gated read/write circuitry 120 in the respective array row 110 via read wordlines (read_wl) numbered 146-0 through 146-N, which are generally referred to herein collectively as read wordlines 146 and individually as read wordline 146, and the bit cells 112 in each array row 110 may be further coupled to the valid-gated read/write circuitry 120 in the respective array row 110 via write wordlines (write_wl) numbered 148-0 through 148-N, which are generally referred to herein collectively as write wordlines 148 and individually as write wordline 148. Additionally, the bit cells 112 in each array row 110 may be coupled to one or more output latches 132 via a respective read bitline (read_bl) and to one or more input latches 132 via a respective write bitline (write_bl). In various embodiments, the memory 100 may further include valid-gated latch clocking 140 coupled to the input/output latches 132 and to the valid-gated read/write circuitry 120 in each array row 110. As such, the array 110 may have substantially identical valid-gated read/write circuitry 120 in each row 110, while the valid-gated latch clocking 140 may be coupled to the input/output latches 132 and to the valid-gated read/write circuitry 120 provided in each row 110 in order to control a read enable clock that opens the output latches 132 and allows the output latches 132 to change state depending on whether an entry read out from the array 110 has a valid or invalid state, and the valid-gated latch clocking 140 may further control a write enable clock that activates the write bitlines and allows the input latches 132 to write input data to an entry in the array 110 depending on whether the input data to be written to the entry in the array 110 has a valid or invalid state.

In various embodiments, as will be described in further detail below with respect to FIG. 2, the valid-gated read/write circuitry 120 may include valid-gated read circuitry used in read operations to read data from an indexed array entry 110, wherein the valid-gated read circuitry may conditionally gate the read wordline 146 according to whether the corresponding array row 110 has a valid or invalid state, and the valid-gated latch clocking 140 may include valid-gated output latch clocking circuitry that may conditionally gate output latch clocking to reduce power consumption due to output switching that may result from propagating a precharged state on the read bitlines 146 to the corresponding output latches 132. More particularly, the read wordline 146 in each array row 110 may be conditionally gated according to the valid bit state stored in the valid-gated read/write circuitry 120. Accordingly, the read wordline will not toggle in any array row 110 that stores a data word having an invalid state. Furthermore, the valid-gated output latch clocking 140 may conditionally block the read clock to the output latches 132 for any array rows 110 in which the bit cells 110 store a data word having an invalid state except for the valid bit stored in the valid-gated read/write circuitry 120. For example, in various embodiments, the valid-gated output latch clocking 140 may derive the read enable clock signal from the valid-gated read circuitry 120, whereby the read enable clock signal to the output latches 132 may remain off and output data does not switch unless the data word stored in corresponding array row 110 has a valid state. However, an external read force signal may be provided to override the valid-gated blocking on the read wordline 146 and the read enable clock signal to the output latches 132, which may allow Built-In Self-Test (BIST) debugging and testing/characterization.

For example, in a read operation, input signals to the valid-gated read/write circuitry 120 and the valid-gated latch clocking 140 may include a read enable signal that may be asserted to start the read operation and thereby launch certain internal signaling. In particular, the internal signaling may comprise an input index that identifies a particular row 110 to read. In various embodiments, the input index may be provided to the valid-gated read/write circuitry 120, which may trigger an unqualified internal read wordline in the row 110 that corresponds to the input index, wherein the unqualified internal read wordline may be used to unconditionally read the indexed valid bit stored in the valid-gated read/write circuitry 120 to indicate whether the data word stored in the corresponding row 110 has a valid or invalid state. However, the valid-gated read/write circuitry 120 may qualify the path to the indexed read wordline 146 that activates the read structures in the array row 110 according to the valid state stored in the valid bit cell. As such, the valid-gated read/write circuitry 120 may block the read circuitry in the array row 110 from toggling if the valid bit cell stores a zero to indicate an invalid state unless the external read force signal is asserted to override the read blocking. Furthermore, the valid-gated read/write circuitry 120 may have a complementary read structure, which may comprise "true" and complementary read bitlines to the valid-gated latch clocking 140, which may include circuitry that unconditionally asserts the read clock to open the output latches 132 if the read bitline that evaluates indicates that the data word stored in the row 110 has a valid state. Otherwise, if the data word stored in the row 110 has an invalid state such that the other (complementary) read bitline evaluates, the valid-gated latch clocking 140 may qualify the read clock according to the external read force signal such that the read clock will not be asserted and the output latches 132 will not open or otherwise change state unless the external read force signal is asserted.

Furthermore, as will be described in further detail below with respect to FIG. 3, the valid-gated read/write circuitry 120 may include valid-gated write circuitry used in write operations to write data to an indexed entry in the array 110, wherein the valid-gated write circuitry may conditionally gate the write wordline 148 according to whether the input data to be written to the indexed entry in the array 110 has a valid or invalid state. Additionally, the valid-gated latch clocking 140 may include valid-gated input latch clocking that may conditionally gate the write enable clock according to whether the input data to be written to the indexed entry in the array 110 has a valid or invalid state, which can provide substantial power savings especially in embodiments where the array 110 has voltage islands with write circuitry on an elevated voltage domain. More particularly, the write wordline 148 in each array row 110 may be conditionally gated according to a valid write signal that indicates whether the input data to be written to the array 110 has a valid or invalid state, except that an external write force signal may be provided to override the default blocking on the write wordline 148. As such, the write wordline 148 may be held inactive unless the valid write signal indicates that the input data to be written to the array 110 has a valid state, the external write force signal is asserted, or both. Furthermore, the valid-gated input latch clocking may conditionally block the write enable clock to the input latches 132, whereby the input latches 132 are not clocked and do not have any signaling on the write bitlines unless the valid write signal indicates that the input data to be written to the array 110 has a valid state, the external write force signal is asserted, or both.

For example, whereas the valid-gated read/write circuitry 120 includes a valid bit cell that stores the valid state information used during read operations, the valid state information used in write operations is provided on the input data (i.e., the data to be written to the array 110). Accordingly, when writing to the array 110, the valid bit cell provided in the valid-gated read/write circuitry 120 may always be written, as valid write wordline and bitline signals input to the valid-gated write circuitry are only gated according to a write enable signal. However, the write wordline 148 used to activate the write circuitry in the corresponding row 110 may be conditionally gated such that the write circuitry only activates when the input data has a valid state and/or the external write force signal is asserted. Otherwise, if the input data has an invalid state and the external write force signal is unasserted, the write wordline 148 to the array row 110 and the write enable clock to the input latches 132 are held inactive. Accordingly, because the write wordlines 148, internal write bitlines, and clocking on the input latches 132 do not toggle in an invalid write (unless the external write force signal is asserted), significant power savings can be realized especially in embodiments where the array 110 has voltage islands with write circuitry on an elevated voltage domain.

Figure 2:
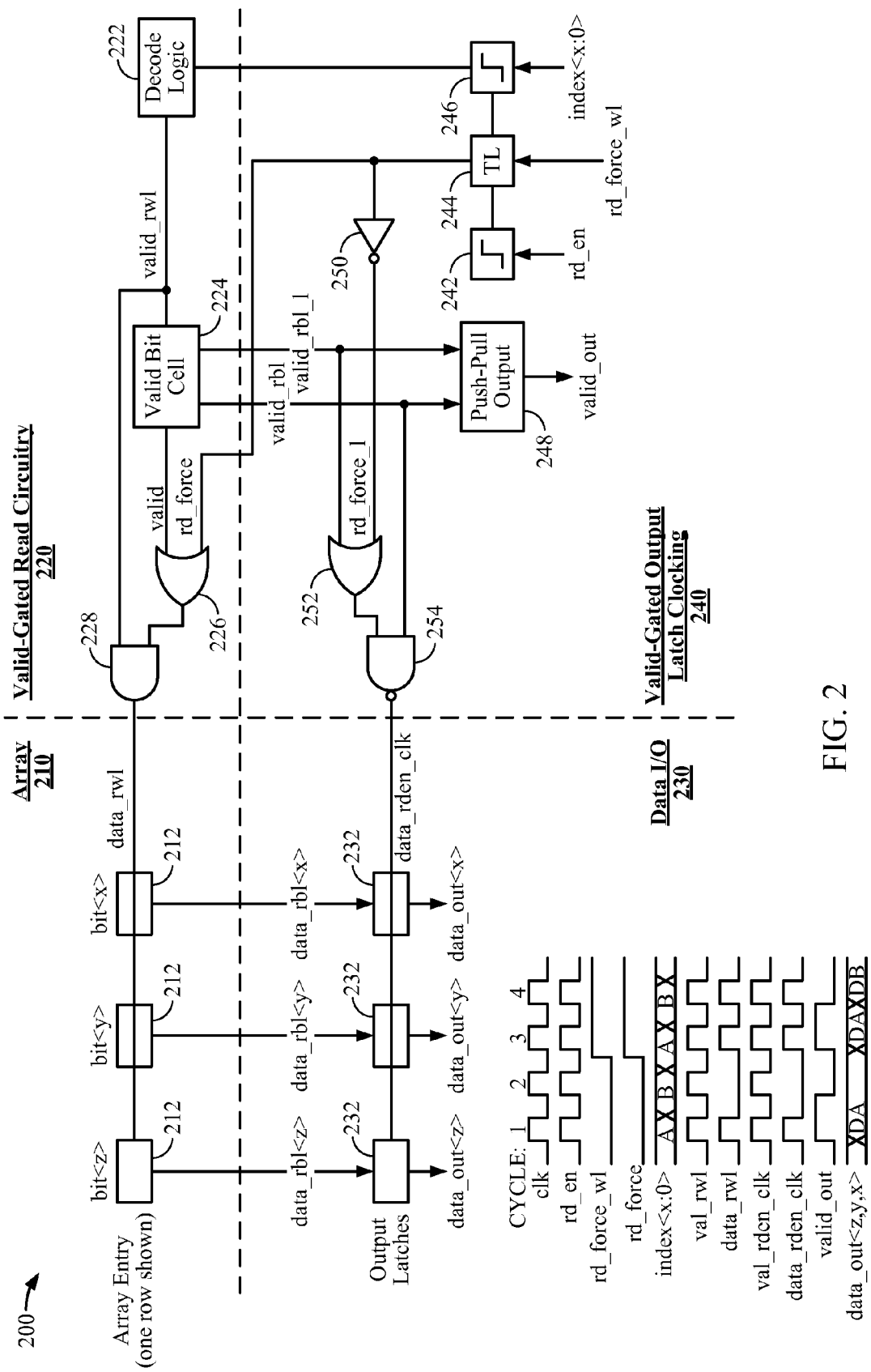
FIG. 2 illustrates exemplary valid-gated read circuitry and valid-gated output latch clocking circuitry used in the memory array shown in FIG. 1, according to various aspects.

According to various aspects, FIG. 2 illustrates exemplary valid-gated read circuitry 220 and valid-gated output latch clocking circuitry 240, which can be used in any suitable array 210 that qualifies each entry with a valid/invalid state. In general, as shown in FIG. 1, the valid-gated read circuitry 220 may be provided in each row within the array 210, wherein each row in the array 210 may include one or more bits 212 configured to store a digital data word. Furthermore, the one or more bits 212 in each row may be coupled to the valid-gated read circuitry 220 in the respective row via a read wordline (data_rwl) and to one or more output latches 232 in a data input/output portion 230 via respective read bitlines (data_rbl<z>, data_rbl<y>, data_rbl<x>, etc.). Furthermore, in various embodiments, the valid-gated output latch clocking circuitry 240 may be coupled to the one or more output latches 232 in the data input/output portion 230 and to the valid-gated read circuitry 220 in each row within the array 210. As such, although FIG. 2 shows one row (or entry) in the array 210 with corresponding valid-gated read circuitry 220, those skilled in the art will appreciate that such illustration is intended solely to simplify the discussion provided herein, in that the array 210 may have substantially identical valid-gated read circuitry 220 in each row, while the valid-gated output latch clocking circuitry 240 may be coupled to the one or more output latches 232 in the data input/output portion 230 and to the valid-gated read circuitry 220 provided in each row to control a read enable clock that opens the output latches 232 and allows the output latches 232 to change state depending on whether an entry read out from the array 210 has a valid or invalid state.

According to various embodiments, the valid-gated read circuitry 220 and the valid-gated output latch clocking circuitry 240 shown in FIG. 2 may generally be used in read operations to read data from an indexed entry in the array 210. For example, as shown in FIG. 2, input signals to the valid-gated read circuitry 220 and the valid-gated output latch clocking circuitry 240 may include a read enable (rd_en) signal 242, which may be asserted to start a read operation and thereby launch certain internal signaling. In particular, in various embodiments, the internal signaling may comprise an index clock 246 associated with an input index<x:0>, which may identify a particular row in the array 210 (e.g., the row shown in FIG. 2). In various embodiments, the input index may be provided to the valid-gated read circuitry 220, which may comprise internal decode logic 222 configured to trigger an unqualified read wordline (valid_rwl) to the decoded address that corresponds to the input index (e.g., where the input index identifies the row in which the internal decode logic 222 is provided). Furthermore, the rd_en signal 242 may launch a read enable clock to one or more output latches 232 in the data input/output portion 230, which includes three columns corresponding to three bits 212 in the illustrated example, although the array 210 and the output latches 232 in the data input/output portion 230 may include more or fewer than three columns. Accordingly, FIG. 2 shows a timing diagram in which the rd_en clock signal 242 allows the output latches 232 to update with the new read state, wherein an output signal from the valid-gated read circuitry 220 to the array 210 comprises an indexed read wordline (data_rwl) that activates read structures in the array 210, and an output signal from the valid-gated output latch clocking circuitry 240 to the data input/output portion 230 comprises a read enable clock (data_rden_clk) that opens the output latches 232 and allows the output latches 232 to change state depending on the data read out from the array 210.

In various embodiments, the valid-gated read circuitry 220 may include a valid bit cell 224, which may generally store an indexed valid bit that indicates whether the data word stored in the bits 212 that make up the corresponding row has a valid or invalid state, wherein the valid-gated read circuitry 220 may unconditionally read the indexed valid bit from the valid bit cell 224 according to the valid_rwl signal output from the decode logic 222. However, the valid-gated read circuitry 220 may qualify the array wordline path from valid_rwl to the indexed read wordline data_rwl, which activates the read structures in the array 210, according to the valid state stored in the valid bit cell 224 using a conditional OR gate 226 and an AND gate 228, wherein inputs to the AND gate 228 may comprise the unqualified valid_rwl output from the decode logic 222 and the output from the conditional OR gate 226. As such, the gates 226, 228 may block read circuitry from toggling in the corresponding row if the valid bit cell 224 stores a zero to indicate an invalid state unless an external force override signal rd_force_wl is asserted to override the read blocking (e.g., to allow Built-In Self-Test (BIST) debugging and testing/characterization). Furthermore, the valid-gated read circuitry 220 may have a complementary read structure, which includes "true" and complementary read bitlines valid_rbl and valid_rbl_l coming off the valid bit cell 224, wherein valid_rbl will toggle if the valid bit cell 224 stores a one to indicate a valid state and valid_rbl_l will toggle if the valid bit cell 224 stores a zero to indicate an invalid state. According, a clock may be provided from the event reading the valid bit cell 224 (i.e., depending on whether valid_rbl or valid_rbl_l toggles). In the case where the valid bit cell 224 stores a one such that valid_rbl toggles, the valid_rbl may be provided to a NAND gate 254 that unconditionally asserts the data_rden_clk signal to open the output latches 232. Otherwise, if the valid bit cell 224 stores a zero such that valid_rbl_l toggles, an OR gate 252 may qualify the valid_rbl_l signal with an inverse of the external force override signal rd_force_l, which may be produced at an inverter 250 coupled to the OR gate 252. In that sense, where the valid bit cell 224 stores a zero or other data to indicate that the data word stored in the corresponding row has an invalid state, the valid_rbl_l clock signal will not propagate to the data_rden_clk signal and the output latches 232 will not be opened or otherwise change state unless the external force override signal rd_force_wl is asserted. Additionally, because the valid bit cell 224 has a true bitline valid_rbl and a complementary bitline valid_rbl_l, no clocking may be required on a valid_out output latch, which can be implemented using a self-clocked push-pull latch 248.

Accordingly, the valid-gated read circuitry 220 may always read the indexed valid bit from the valid bit cell 224 using the unqualified valid_rwl signal and conditionally gate the array wordline path from valid_rwl to data_rwl using the valid bit state stored in the valid bit cell 224 to qualify the subsequent data rwl. As such, the valid-gated read circuitry 220 may prevent data_rwl from toggling if an invalid entry is read. The data_rden_clk signal to the external output latches 232 is also blocked using the valid-gated output latch clocking circuitry 240 for the data bits 212 other than the valid bit 224, wherein the valid-gated output latch clocking circuitry 240 may derive data_rd_en_clk from the valid-gated read circuitry 220. In particular, for a valid access, the valid-gated output latch clocking circuitry 240 may derive data_rden_clk directly from valid_rbl, where data_rd_en_clk will be off (or low) in the valid_rbl precharge state. When the valid_rbl evaluates (i.e., toggles low), data_rden_clk will toggle high and open the output latch 232 transparency. In contrast, for an invalid access, valid_rbl will not evaluate and the data_rden_clk signal remains off, whereby the output data does not switch. Furthermore, because valid_rbl does not evaluate for an invalid read, the complimentary read structure corresponding to the valid_rbl and valid_rbl_l signals provide an additional clock source to the output latches 232 that evaluates during an invalid read. As such, valid_rbl evaluates and provides the source for the data_rden_clk signal in a valid read access, whereas valid_rbl_l evaluates and provides the source for the data_rden_clk signal in an invalid read access. In the latter case, the path from valid_rbl_l to data_rden_clk is qualified with rd_force_l, whereby the path the path from valid_rbl_l to data_rden_clk only toggles when rd_force_wl is asserted.

Furthermore, the valid-gated read circuitry 220 and the valid-gated output latch clocking circuitry 240 may be overridden with the external rd_force_wl signal used for debug and test/characterization. As such, the external rd_force_wl signal allows data_rwl and data_rden_clk to toggle when accessing an otherwise invalid entry. As such, when an invalid entry is accessed and rd_force_wl is asserted, the data_rwl signal on the accessed row will toggle due to the gating that qualifies valid_rwl according to (valid II rd_force). Furthermore, because a complimentary read structure is provided on the valid bit cell 224, the valid_out output latch can be implemented using the self-clocked push-pull latch 248, whereby the read bitline that evaluates from the valid bit cell 224 (i.e., either valid_rbl or valid_rbl_l) will activate the associated push-pull write driver field-effect transitor (FET) and will also gate the contending feedback path in the self-clocked push-pull latch 248. As such, no additional read enable clocking may be needed for the valid_out output latch.

To illustrate an exemplary use case, the timing diagram shown in FIG. 2 illustrates how the valid-gated read circuitry 220 and the valid-gated output latch clocking circuitry 240 may operate in a situation where the array 210 includes a valid entry A that stores a first data word DA and an invalid entry B that stores a second data word DB. In that context, the valid bit associated with valid entry A and invalid entry B is read in each clock cycle, the first clock cycle reads the data word DA from valid entry A, the second clock cycle does not read the data word DB from invalid entry B due to the read blocking, the third clock cycle again reads the data word DA from valid entry A, and the fourth clock cycle reads the data word DB from invalid entry B even though entry B is invalid because rd_force is asserted to force the read from the invalid entry B.

Figure 3:
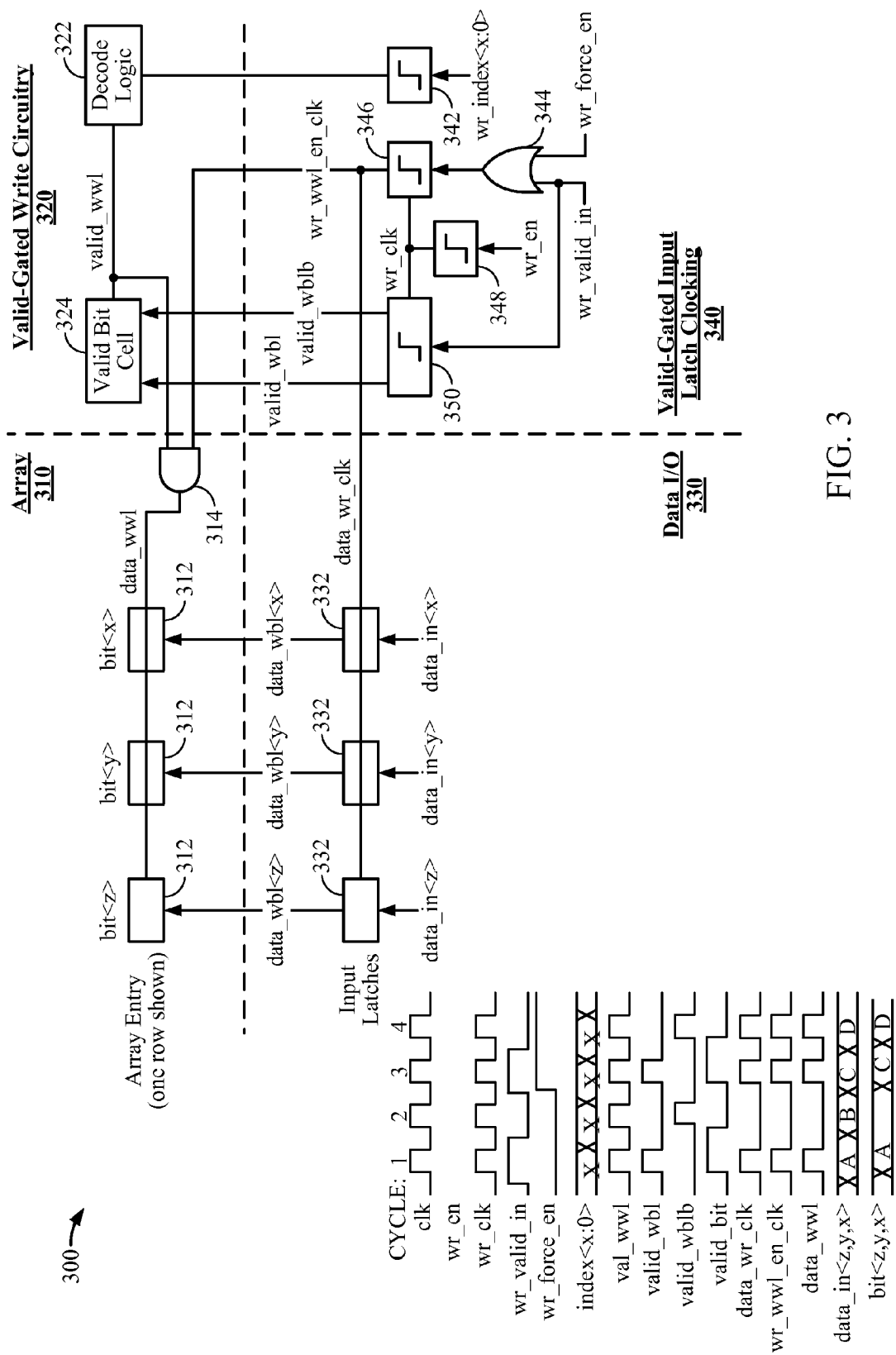
FIG. 3 illustrates exemplary valid-gated write circuitry and valid-gated input latch clocking circuitry used in the memory array shown in FIG. 1, according to various aspects.

According to various aspects, referring now to FIG. 3, exemplary valid-gated write circuitry 320 and valid-gated input latch clocking circuitry 340 is shown, wherein the valid-gated write circuitry 320 and the valid-gated input latch clocking circuitry 340 can be used in any suitable array 310 that qualifies each entry with a valid/invalid state. In general, as shown in FIG. 1, the valid-gated write circuitry 320 may be provided in each row within the array 310, wherein each row in the array 310 may include one or more bits 312 configured to store a digital data word. Furthermore, the one or more bits 312 in each row may be coupled to the valid-gated write circuitry 320 in the respective row via a write wordline (data_wwl) and to one or more input latches 332 in a data input/output portion 330 via respective write bitlines (data_wbl<z>, data_wbl<y>, data_wbl<x>, etc.). Furthermore, in various embodiments, the valid-gated input latch clocking circuitry 340 may be coupled to the one or more input latches 332 in the data input/output portion 330 and to the valid-gated write circuitry 320 in each row within the array 310. As such, although FIG. 3 shows one row (or entry) in the array 310 with corresponding valid-gated write circuitry 320, those skilled in the art will appreciate that such illustration is intended solely to simplify the discussion provided herein, in that the array 310 may have substantially identical valid-gated write circuitry 320 in each row, while the valid-gated input latch clocking circuitry 340 may be coupled to the one or more input latches 332 in the data input/output portion 330 and to the valid-gated write circuitry 320 provided in each row to control a write enable clock that activates the write bitlines and allows the input latches 332 to write input data to an entry in the array 310 depending on whether the input data has a valid or invalid state.

According to various embodiments, the valid-gated write circuitry 320 and the valid-gated input latch clocking circuitry 340 shown in FIG. 3 may generally be used in write operations, wherein the valid-gated write circuitry 320 and the valid-gated input latch clocking circuitry 340 may differ from the valid-gated read circuitry 220 and the valid-gated output latch clocking circuitry 240 shown in FIG. 2 in that the valid bit cell 224 shown in FIG. 2 stores the valid state information used during read operations. On the other hand, in FIG. 3, the valid state information used in write operations is provided on the input data (i.e., the data to be written). Accordingly, in FIG. 3, a write valid input signal (wr_valid_in) corresponds to the valid data to be written to an indexed entry in the array 310, which may also be used as the write enable signal (wr_en). As such, when writing an entry to the array 310, the indexed valid bit cell 324 may always be written, as a valid_wwl signal output from the decode logic 322 and complementary valid write bitline signals (valid_wbl and valid_wblb) input to the valid-gated write circuitry 340 are only gated according to a write enable signal (wr_en). However, the data bits 312 in the array 310 may be conditionally gated using an OR gate 344 such that write circuitry associated with the data bits 312 only activate when (wr_valid_in II wr_force_en=1); otherwise, both data_wwl and data_wr_clk are held inactive to save power (i.e., similar to a read operation, wr_force provides an override to facilitate debug and testing). Furthermore, because write clocking in the array 310 is blocked during an invalid write, the state associated with the input bits may be preserved, which can provide a valuable system debug resource. In various embodiments, to conditionally block the write wordline (data_wwl) to the array 310, the indexed valid_wwl may be combined with another return-to-zero (RTZ) phase clock (wr_wwl_en_clk) generated from an input clock gating cell (CGC) latch 346 with (wr_valid_in II wr_force_en) as an input. Accordingly, the resulting gated write wordline (data_rwl) will only toggle if either or both inputs wr_valid_in and wr_force_en are asserted, whereas wr_wwl_en_clk is held at zero for an invalid write where wr_force_en is zero. Furthermore, the clocking to the data input latches 332 is also conditionally gated using another phase clock (data_wr_clk) derived from the above-mentioned input CGC latch 346. Therefore, if wr_valid_in is zero (invalid write) and wr_force_en is zero, the input latches 332 are not clocked and there will not be any signaling on the write bitlines, which remain floating. Accordingly, because the write wordlines, input latch clocking, and internal write bitlines do not toggle in an invalid write (unless the wr_force_en signal is asserted), significant power savings can be realized especially in embodiments where the array 310 has voltage islands with write circuitry on an elevated voltage domain.

To illustrate an exemplary use case, the timing diagram shown in FIG. 3 illustrates how the valid-gated write circuitry 320 and the valid-gated input latch clocking circuitry 340 may operate in various write operations. In particular, during the first clock cycle, a valid write occurs such that a data word A is written to the data bits 312. In the second clock cycle, an invalid write occurs, whereby the data bits 312 are not written. In the fourth clock cycle, an invalid write occurs, but the data bits 312 are written because wr_force is asserted. However, the indexed valid bit cell 324 is unconditionally written in each clock cycle, although data_wr_clk and data_wwl do not toggle in clock cycles that involve invalid write operations, thereby preserving the entries even in an invalid write operation to provide information that may be useful for debugging or other purposes.

According to various aspects, the memory array structure, the valid-gated circuitry (e.g., valid-gated read circuitry 220, valid-gated output latch clocking circuitry 240, valid-gated write circuitry 320, valid-gated input latch clocking circuitry 340, etc.) and the corresponding methods described herein can be employed in any circuit, including but not limited to a microprocessor-based circuit or system. Furthermore, the memory array structure, the valid-gated circuitry, and the corresponding methods described herein can be employed in any memory that qualifies each entry stored therein with a valid/invalid state, wherein such memories may include, without limitation, system memory or cache memory, which can be further included or employed in any suitable electronic device. For example, electronic devices that can include or otherwise employ the memory array structure, the valid-gated circuitry, and the corresponding methods described herein can comprise, without limitation, mobile phones, cellular phones, computers, portable computers, desktop computers, personal digital assistants (PDAs), monitors, computer monitors, televisions, tuners, radios, satellite radios, digital music players, portable music players, digital video players, digital video disc (DVD) players, portable digital video players, or the like.

Figure 4:
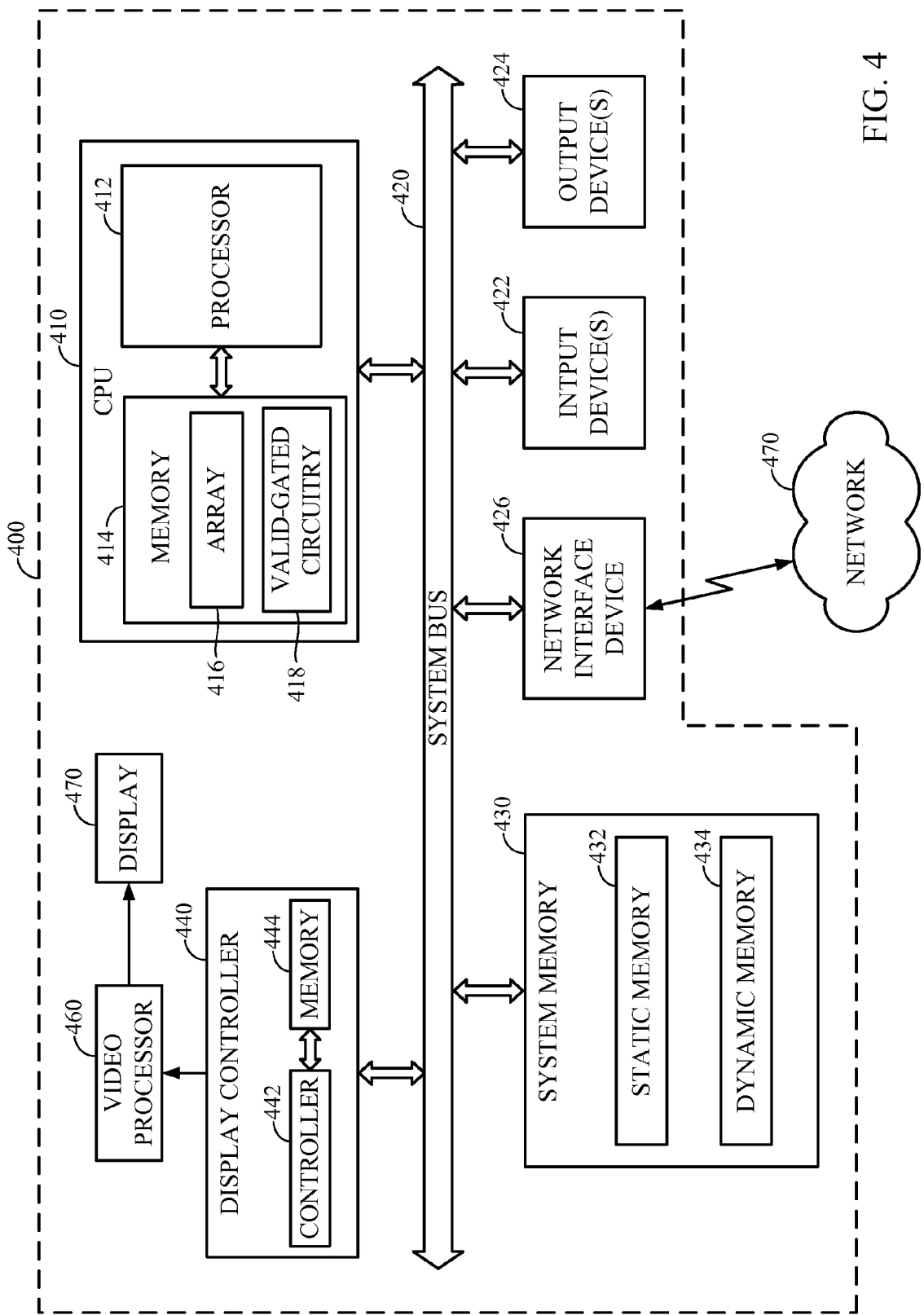
FIG. 4 illustrates an exemplary processor-based system that can employ the memory array, valid-gated read/write circuitry, valid-gated latch clocking circuitry, and methods described herein, according to various aspects.

According to various aspects, FIG. 4 illustrates an example processor-based system 400 that can employ the memory array, valid-gated read/write circuitry, valid-gated latch clocking circuitry, and methods previously described with respect to FIG. 1 through FIG. 3. For example, the processor-based system 400 shown in FIG. 4 includes a central processing unit (CPU) 410 having a microprocessor 412, which may be configured to communicate with a memory 414 to read data from and write data to an array 416 subject to valid-gated circuitry 418 as described above with respect to FIG. 1 through FIG. 3. In particular, as described in further detail above with respect to FIG. 2, the valid-gated circuitry 418 may comprise valid-gated read circuitry and valid-gated output latch clocking configured to block a data read wordline and output latch clocking from toggling on any entries in the array 416 unless the entries have a valid state or a signal is asserted to force the data read wordline and output latch clocking to toggle. Similarly, as described in further detail above with respect to FIG. 3, the valid-gated circuitry 418 may comprise valid-gated write circuitry and valid-gated input latch clocking configured to block a data write wordline and input latch clocking from toggling on any entries in the array 416 unless input data to be written to the entries in the array 416 have a valid state or an external signal is asserted to force the data write wordline and input latch clocking to toggle.

In various embodiments, the CPU 410 is coupled to the system bus 420, which intercouples the other devices included in the processor-based system 400. As would be apparent to those skilled in the art, the CPU 410 may exchange address, control, and data information over the system bus 420 to communicate with the other devices included in the processor-based system 400, which can include suitable devices. For example, as illustrated in FIG. 4, the devices included in the processor-based system 400 can include system memory 430, one or more input devices 422, one or more output devices 424, a network interface device 426, and a display controller 440.

The input devices 422 can include any suitable input device type, including but not limited to input keys, switches, voice processors, etc. The output devices 424 can similarly include any suitable output device type, including but not limited to audio, video, other visual indicators, etc. The network interface device 426 can be any device configured to allow exchange of data to and from a network 470, which may comprise any suitable network type, including but not limited to a wired or wireless network, private or public network, a local area network (LAN), a wide local area network (WLAN), and the Internet. The network interface device 426 can support any type of communication protocol desired. The CPU 410 can access the system memory 430 over the system bus 420. The system memory 430 can include static memory 432 and/or dynamic memory 434.

The CPU 410 can also access the display controller 440 over the system bus 420 to control information sent to a display 470. The display controller 440 can include a memory controller 442 and memory 444 to store data to be sent to the display 470 in response to communications with the CPU 410. The display controller 440 sends information to the display 470 to be displayed via a video processor 460, which processes the information to be displayed into a format suitable for the display 470. The display 470 can include any suitable display type, including but not limited to a cathode ray tube (CRT), a liquid crystal display (LCD), a plasma display, etc.

Those skilled in the art would further appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those skilled in the art may implement the described functionality in various ways for each particular application, but such implementation decisions should not be interpreted as causing a departure from the scope of the present disclosure.

The various illustrative logical blocks, modules, and circuits described in connection with the embodiments disclosed herein may store and compare any type of data, including but not limited to tag data, and may be implemented or performed with any signal levels to provide logical true and logical false. Logical true can be represented as a logical high ("1", $V_{DD}$) and logical false as a logical low ("0", $V_{SS}$), or vice versa. The various illustrative logical blocks, modules, and circuits described in connection with the embodiments disclosed herein can also be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those skilled in the art will further understand that the operational steps illustrated in the flow chart diagrams may be subject to numerous different modifications as will be readily apparent to one of skill in the art. Those skilled in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The steps of a method or algorithm described in connection with the embodiments disclosed herein may be embodied directly in hardware, in a software module executed by a processor, or in a combination of the two, and need not be performed in any particular order. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

The previous description is provided to enable any person skilled in the art to make or use the disclosure. Various modifications will be readily apparent to those skilled in the art, and the generic principles defined herein may be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. A memory, comprising:
an array having one or more rows configured to store a data word, wherein the one or more rows each include valid-gated read circuitry configured to store data that indicates whether the data word stored in the corresponding row has a valid state and conditionally gate a read wordline path in the corresponding row according to at least the stored data;
one or more output latches configured to output data read from the array; and
valid-gated output latch clocking coupled to the one or more output latches and to the valid-gated read circuitry in each row, wherein the valid-gated output latch clocking includes circuitry configured to conditionally gate a read clock configured to open the one or more output latches according to at least the stored data that indicates whether the data word stored in an indexed row in the array has a valid state.

2. The memory recited in claim 1, wherein the valid-gated read circuitry in each row comprises at least one logic gate configured to conditionally gate the read wordline path according to the stored data that indicates whether the data word stored in the row has a valid state and a read force signal that forces the read wordline to toggle when asserted.

3. The memory recited in claim 2, wherein the at least one logic gate is configured to block the read wordline from toggling unless the stored data indicates that the data word stored in the row has a valid state or the read force signal is asserted.

4. The memory recited in claim 2, wherein the circuitry associated with the valid-gated output latch clocking comprises at least one logic gate configured to conditionally gate the read clock according to the stored data that indicates whether the data word stored in the indexed row has a valid state and the read force signal.

5. The memory recited in claim 4, wherein the at least one logic gate is configured to block the read clock from toggling unless the stored data indicates that the data word stored in the row has a valid state or the read force signal is asserted.

6. The memory recited in claim 5, wherein the read clock has a low precharge state and the at least one logic gate comprises:
- an inverter configured to output an inverse of the read force signal;
- an OR gate configured to receive inputs that comprise the output from the inverter and a first read bitline output from the valid-gated read circuitry in the indexed row, wherein the first read bitline toggles to a logic low if the data word stored in the indexed row has an invalid state; and
- a NAND gate configured to receive inputs that comprise the output from the OR gate and a second read bitline output from the valid-gated read circuitry in the indexed row, wherein the second read bitline toggles to a logic low if the data word stored in the indexed row has a valid state, wherein the read clock signal comprises an output from the NAND gate such that the read clock toggles high when the when the second read bitline toggles to the logic low to indicate that the data word stored in the indexed row has a valid state or the output from the inverter toggles low to indicate that the read force signal is asserted.

7. The memory recited in claim 6, wherein the valid-gated output latch clocking further comprises a self-clocked push-pull latch coupled to the first read bitline and the second read bitline output from the valid-gated read circuitry in the indexed row.

8. A method for qualified read access in an array, comprising:
- conditionally gating a read wordline associated with an array entry according to at least a first signal that indicates whether a data word stored in the array entry has a valid or invalid state; and
- conditionally gating an output latch clock signal according to at least the first signal that indicates whether the data word stored in the array entry has a valid or invalid state.

9. The method recited in claim 8, further comprising:
- conditionally gating the read wordline associated with the array entry according to a second signal that forces the read wordline to toggle when asserted.

10. The method recited in claim 9, wherein conditionally gating the read wordline associated with the array entry according to the first signal and the second signal blocks the read wordline from toggling unless the first signal indicates that the array entry has a valid state or the second signal is asserted to force the read wordline to toggle.

11. The method recited in claim 9, further comprising:
- conditionally gating the output latch clock signal according to the second signal.

12. The method recited in claim 11, wherein conditionally gating the output latch clock signal according to the first signal and the second signal blocks the output latch clock signal from toggling unless the first signal indicates that the array entry has a valid state or the second signal is asserted.

13. The method recited in claim 12, wherein the output latch clock signal has a low precharge state and is conditionally gated using a NAND gate according to an inverse of the first signal and an inverse of the second signal such that the output latch clock signal toggles high when the inverse of the first signal toggles low to indicate that the array entry has a valid state or the inverse of the second signal toggles low to indicate that the second signal is asserted.

14. An apparatus, comprising:
- means for storing a data word;
- means for conditionally gating a read wordline used to read the stored data word according to at least a first signal that indicates whether the stored data word has a valid state;
- means for conditionally gating an output latch clock signal according to at least the first signal that indicates whether the stored data word has a valid state.

15. The apparatus recited in claim 14, wherein the means for conditionally gating the read wordline used to read the stored data word comprises means for conditionally gating the read wordline according to the first signal that indicates whether the stored data word has a valid state and a second signal that forces the read wordline to toggle when asserted.

16. The apparatus recited in claim 15, wherein the means for conditionally gating the read wordline comprises means for blocks the read wordline from toggling unless the first signal indicates that the array entry has a valid state or the second signal is asserted.

17. The apparatus recited in claim 15, wherein the means for conditionally gating the output latch clock signal comprises means for conditionally gating the output latch clock signal according to the second signal.

18. The apparatus recited in claim 17, wherein the means for conditionally gating the output latch clock signal comprises means for blocking the output latch clock signal from toggling unless the first signal indicates that the array entry has a valid state or the second signal is asserted.

19. A memory, comprising:
- an array having one or more rows configured to store a data word, wherein the one or more rows each include valid-gated write circuitry configured to conditionally gate a write wordline path in the corresponding row according to at least a first signal that indicates whether input data to be written to the corresponding row has a valid state;
- one or more input latches coupled to one or more bitlines configured to activate write circuitry in the array; and
- valid-gated input latch clocking coupled to the one or more input latches and to the valid-gated write circuitry in each row, wherein the valid-gated input latch clocking includes circuitry configured to conditionally gate a write clock to the one or more input latches according to at least the first signal that indicates whether the input data to be written has a valid state.

20. The memory recited in claim 19, wherein the valid-gated write circuitry in each row comprises at least one logic gate configured to conditionally gate the write wordline path according to the first signal that indicates whether the input data to be written has a valid state and a write force signal that forces the write wordline to toggle when asserted.

21. The memory recited in claim 20, wherein the at least one logic gate is configured to block the write wordline from toggling unless the first signal indicates that the input data to be written has a valid state or the second signal is asserted.

22. The memory recited in claim 20, wherein the circuitry associated with the valid-gated input latch clocking comprises at least one logic gate configured to conditionally gate the write clock according to the first signal and the write force signal.

23. The memory recited in claim 22, wherein the at least one logic gate is configured to block the write clock from toggling unless the first signal indicates that the input data to be written has a valid state or the second signal is asserted.

24. The memory recited in claim 22, wherein the circuitry associated with the valid-gated input latch clocking is further configured to unconditionally write an indexed valid bit stored in the corresponding row to preserve the state associated with the input data.

25. A method for qualified write access in an array, comprising:
   conditionally gating a write wordline associated with an array entry according to at least a first signal that indicates whether input data to be written to the array entry has a valid or invalid state; and
   conditionally gating an input latch clock signal according to at least the first signal that indicates whether the input data to be written has a valid or invalid state.

26. The method recited in claim 25, further comprising:
   conditionally gating the write wordline associated with the array entry according to a second signal that forces the write wordline to toggle when asserted.

27. The method recited in claim 26, wherein conditionally gating the write wordline associated with the array entry according to the first signal and the second signal blocks write clocking on the write wordline from toggling unless the first signal indicates that the input data to be written to the array entry has a valid state or the second signal is asserted.

28. The method recited in claim 26, further comprising:
   conditionally gating the input latch clock signal according to the second signal.

29. The method recited in claim 28, wherein conditionally gating the input latch clock signal according to the first signal and the second signal blocks the input latch clock signal from toggling unless the first signal indicates that the input data to be written to the array entry has a valid state or the second signal is asserted.

30. The method recited in claim 28, further comprising:
   unconditionally writing an indexed valid bit associated with the array entry to preserve the state associated with the input data to be written to the array entry.

31. An apparatus, comprising:
   means for conditionally gating a write wordline used to write input data to an array entry according to at least a first signal that indicates whether the input data to be written to the array entry has a valid or invalid state; and
   means for conditionally gating an input latch clock signal according to at least the first signal that indicates whether the input data to be written has a valid or invalid state.

32. The apparatus recited in claim 31, wherein the means for conditionally gating the write wordline comprises means for conditionally gating the write wordline according to a second signal that forces the write wordline to toggle when asserted.

33. The apparatus recited in claim 32, wherein the means for conditionally gating the write wordline comprises means for blocking write clocking on the write wordline from toggling unless the first signal indicates that the input data to be written to the array entry has a valid state or the second signal is asserted.

34. The apparatus recited in claim 32, wherein the means for conditionally gating the input latch clock signal comprises means for conditionally gating the input latch clock signal according to the second signal.

35. The apparatus recited in claim 34, wherein the means for conditionally gating the input latch clock signal comprises means for blocking the input latch clock signal from toggling unless the first signal indicates that the input data to be written to the array entry has a valid state or the second signal is asserted.

36. The apparatus recited in claim 34, further comprising:
   means for unconditionally writing an indexed valid bit associated with the array entry to preserve the state associated with the input data to be written to the array entry.

* * * * *